(12) United States Patent
Berg et al.

(10) Patent No.: US 7,593,850 B2
(45) Date of Patent: *Sep. 22, 2009

(54) METHODS FOR COLLECTING MEDIA SEGMENTS IN A MEDIA SIGNAL VIA COMPARING SEGMENTS OF THE SIGNAL TO LATER SEGMENTS

(75) Inventors: Rickard Berg, Stockholm (SE); Tomas Ahrne, Enskede (SE); Jakob Berg, Stockholm (SE)

(73) Assignee: Popcatcher AB, Stockholm (SE)

( * ) Notice: Subject to any disclaimer, the term of this patent is extended or adjusted under 35 U.S.C. 154(b) by 418 days.

This patent is subject to a terminal disclaimer.

(21) Appl. No.: 10/525,370

(22) PCT Filed: Aug. 22, 2003

(86) PCT No.: PCT/SE03/01305

§ 371 (c)(1),
(2), (4) Date: Aug. 4, 2005

(87) PCT Pub. No.: WO2004/019201

PCT Pub. Date: Mar. 4, 2004

(65) Prior Publication Data

US 2006/0104437 A1   May 18, 2006

(30) Foreign Application Priority Data

Aug. 23, 2002   (SE)   .................... 0202447

(51) Int. Cl.
*G10L 21/02*   (2006.01)
*G11B 27/00*   (2006.01)

(52) U.S. Cl. ........................ 704/226; 704/227; 704/228; 386/52

(58) Field of Classification Search .................. 704/270, 704/278, 226–228; 386/46, 52; 380/200
See application file for complete search history.

(56) References Cited

U.S. PATENT DOCUMENTS 4,602,297 A * 7/1986 Reese .......................... 386/52

(Continued)

FOREIGN PATENT DOCUMENTS

WO   WO 96/27840   9/1996
WO   WO 02/069148   9/2002

OTHER PUBLICATIONS

Khaled El-Maleh et al.: Speech/Music Discrimination for Multimedia Applicaitons. Conf 2000 IEEE Int. Conf. On Acoustics, Speech, and Signal Processing, Instanbul, Turkey, Jun. 5-9, 2000. Publ.—2000, Piscataway, NJ, USA, IEEE, USA, pp. 2445-2448 vol. 4.

(Continued)

*Primary Examiner*—Patrick N Edouard
*Assistant Examiner*—Douglas C Godbold
(74) *Attorney, Agent, or Firm*—Bacon & Thomas, PLLC

(57) ABSTRACT

A method to achieve signals which are essentially devoid of unwanted signal components uses a search and comparison process. Media signals are received through receiving means, the media signals containing unwanted signal components, a representation for the media signals is chosen, and the media signals are processed in such a way that the unwanted signal components are essentially removed and the remaining signal components are saved. The method includes the steps of: from the media signals, choosing a search key representation; in a search track, conducting a first search after a signal representation that contains a section which is essentially identical with the search key; comparing a first segment, which lies before and after the search key, with a second segment which lies before and after the section, which is essentially identical with the first search key; from said first segment and the second segment, finding a common segment; and storing the common segment in the memory domain as a signal representation without unwanted signal components.

10 Claims, 11 Drawing Sheets

Display of a Radiobroadcast

PopCatcher continuously records the broadcast.

U.S. PATENT DOCUMENTS

| | | | |
|---|---|---|---|
| 5,621,454 A | | 4/1997 | Ellis et al. |
| 5,668,917 A | * | 9/1997 | Lewine ......................... 386/52 |
| 5,696,866 A | * | 12/1997 | Iggulden et al. ............... 386/46 |
| 5,739,451 A | | 4/1998 | Winksy et al. |
| 5,870,583 A | | 2/1999 | Maeda |
| 5,987,210 A | * | 11/1999 | Iggulden et al. ............... 386/46 |
| 6,088,455 A | * | 7/2000 | Logan et al. ................. 380/200 |
| 6,185,527 B1 | | 2/2001 | Petkovic et al. |
| 6,438,513 B1 | | 8/2002 | Pastor et al. |
| 7,062,442 B2 | * | 6/2006 | Berg et al. .................. 704/270 |
| 7,076,102 B2 | * | 7/2006 | Lin et al. .................... 382/218 |
| 2002/0120456 A1 | | 8/2002 | Berg et al. |

OTHER PUBLICATIONS

Moreno, P.J. et al.: Using the Fisher Kernel Method for Web Audio Classification. Conf.—2000 IEEE Int. Conf. on Acoustics, Speech, and Signal Processing; Istanbul, Turkey, Jun. 5-Jun. 2000, Proc., Publ 2000—IEEE, Piscataway, NJ, USA, ISSN 0736-7791, vol. 4, pp. 2417-2420.

* cited by examiner

Flowchart lists

What are the lists that are searched

METHODS FOR COLLECTING MEDIA SEGMENTS IN A MEDIA SIGNAL VIA COMPARING SEGMENTS OF THE SIGNAL TO LATER SEGMENTS

The present invention relates to an improvement of a method and a system used to receive and process a media signal in such a way that unwanted signals are removed while the wanted signals are saved.

RELATED ART AND RELATED APPLICATIONS

As was mentioned above the present invention relates to an improvement of a method and a system used to receive and process media signals, signals such as radio signals or TV-signals, in such a manner that only the wanted signals are saved while the unwanted signals are removed. As unwanted signals are intended, for example, commercials, jingles, speech from a discjockey, during a radio broadcast or such signals as commercials, logotypes and alike during TV-broadcasted movies. The method and the system are in broad terms intended to provide a way to record, or remove, material from a broadcasted signal and display these signals to a user in a format where all the unwanted signals have been removed.

The system and the method used to remove unwanted signals or get hold of wanted signals use an algorithm that is given below in a schematic form;
1. receive the media signals through receiver means,
2. save the received signals in therefore intended memories,
3. choose a first search key through manual or automatic activation
4. search among media signals for a second key which is essentially the same as the first key, the search is conducted in future broadcasted media signals or in media signal broadcasts that has already been recorded and saved,
5. compare first segments, wherein said segments are located before and after the first search key, with second segments which are located before and after said second key,
6. identify a first common segment between the first and second segment, which segments are considered to be source material such as a track on a CD.

If this algorithm is iterated, that is, if further searches and comparison processes are conducted among media signals which all contain search keys that are essentially the same as the first defined search key, and these signals are saved and compared, with regard to segments, among earlier source material, it is possible to achieve longer and longer common segments and thereby determine which the wanted signals are, and also which the unwanted signals are. The system and the method may benefit from the ability to both delete and save source material, or representations thereof, alternatively to only log representations of the source material or segments therebetween.

A more detailed description of the system and the method, and also of prior art can be found in PCT/US02/05537, which has the same applicant as the present invention.

BACKGROUND OF THE INVENTION

Before a short description of the present invention is given the definitions of the terminology used in the application is presented.

If nothing else is stated "media signals" and "source material" are defined as representation of the broadcasted signals, on analog or digital form, but the expressions could also defined as any representation at all that make a comparison process possible.

"Search key" is defined as a section of the above given representation, a section that could be very short, of the order of magnitude fractions of seconds, or very long. The actual application of the system and the method determine the length of the search key. In the case the user intends to record music from a radio broadcast the search key could for example be as long as a few music tracks to thereby reproduce a song that does not contain commercials and other unwanted material in the music. The search key can be obtained by manual activation of a key choosing process. In the example relating to radio broadcasted music, a user could for example, activate this process if he or she hears a song on the radio and wants to record it. The user himself will then manually activate the search key process by, for example, pressing a button, and the system will react and pick out a segment of the signal representation as a key and use this segment as a search key in a later comparison process. The key setting process could also be activated automatically, an alternative that will be described in more detail below.

The term "search key" could also be intended as a representation of the above given representation, e.g., a small part that is saved with low band width and than saved, for example, according to a sound compression method.

In the remaining parts of this description the term "search key" will be used interchangeably with the term "search key representation". The difference between these terms should be clear, since it only relates to what type of representation is given to the original search key.

"An iterative process" is intended as an algorithm that compares segments of signal representations, signal representations that contains an essentially common search key, to obtain longer and longer common segments by using this algorithm. This process can proceed until the system, according to some predetermined growth conditions, terminates the process, for example when the iterations do not give an increased time length for the common signal sequences. If an exact match is obtained between different segments, it is very likely that the representation is a version that does not contain any unwanted signals.

In this application "search track" is defined as the material that is saved and used in the comparison process that saves or deletes the final version of the signal representation, or that logs where this is located in the memory domain.

With this comparison process the search track can be shortened/reduced dramatically by, for example, letting the system remove representations of the source material and only perform searches in the sections of the search track that are relevant for finding new source material.

The search track could, for example, be saved in the frequency domain, as a whole or as a much more compressed search track in order to reduce the required amount of memory or the required amount of processing power.

Other terms used in this application will be defined as it is introduced.

One problem with the procedure according to steps i)-vi) given above is the necessity to save large amounts of source material. The present invention relates to methods for improving this aspect of the system and method according to PCT/US02/05537. Further improvements relate to certain choices of the search key and to the activation of the process/method in the system, and also to different approaches for processing the search track, i.e., the section of the saved signal representation that is searched in order to find essentially identical key representations and which is also used as material for the comparison process in the application PCT/US02/05537. Improvements over the above given system and method are briefly summarised below. They will be described in more detail in a later part of this application.

It is very advantageous if the search tracks, i.e., the materal that is searched and exposed to the comparison process, is normalized when the signals are received. Normalization means that the signal representations are given a common amplitude/sound level the moment they are received. In this manner the number of required computations in a comparison process will be vastly reduced. The reduction of the number of computations follows from the fact that it will not be necessary to normalize the search track for every comparison process.

It is possible to remove masking effects that have been added to the signals. It is thereby possible to save only those parts of the signal representations that can be perceived by the user. This procedure makes it easier for the system to find representations of the search key and makes it possible to reduce the size of the search track.

It is possible to make the the search track and the search key smaller by compressing all signal representations, either by a destructive compression or a non-destructive compression.

Saving compressed representations requires less memory capacity.

A high pass filter could be used to remove DC-currents from the signal representation. This filter could be used for both the search track and the search key. By using a high-pass filter it is possible to give all signal amplitudes a common zero point in the used representation.

It is also very advantegous to give the search track a smaller band width. If the search track/signal representation is saved with smaller band-width the demands on the system's memory capacity can be reduced and the method becomes faster.

The search track, i.e., the source material that contains the signal representations, is preferably processed in such a way as to make it smaller by removing all known unwanted signals. Various methods that make this possible will be described in a later part of this application.

It is very advantageous if only certain selected parts of the representation are saved. In this way the required processing power, the required memory and the number of computations that the system needs to perform are reduced. If the search track is saved for every N:th sample (where N is larger than 1) the memory demands on the system is vastly reduced. This search track can then be compared to a search key that is saved in another format, for example with another value of N. This adds up to a drastically reduced memory demand and/or a faster method, something that in the end makes it possible to produce the product at a lower cost for the customer.

A method according to the present invention aimed to make use of only certain sections of a signal representation yields a more capacity saving system than the system that is used in the comparison process defined above. It is for example possible to use, In case the signal representation is taken from av television broadcast, it is for example possible to use only sound, percentages of pixels of a certain colour, etc.

It should be noted that a system that is constructed to run the method, for example for recording music from a radio broadcast, can reduce the memory capacity and the required processing power by deleting music from the search track (or log where the found music is located). If, by using the method given above, the system already have identified essentially identical search track segments the latter found segments, which were found in the search track by the present method, can be deleted. It is also possible to delete the segments that lie between these segments, if that is desired. The opposite applies to movies, where the interest lies in removing the commercial while leaving the movie unaltered.

Media signals can be saved or deleted during the actual recording procedure, but it is possible to perform this step when the media signals are moved to other memory domains or at the actual display of the signals, the system for example displays a movie without commercials, the commercial is actually there but it will not be broadcasted during the movie broadcast.

Further improvements over the system disclosed in PCT/US02/05537 relate to preloaded lists and afterloaded lists. These will be defined and described in more details below.

DETAILED DESCRIPTION OF THE INVENTION

Figure 1:
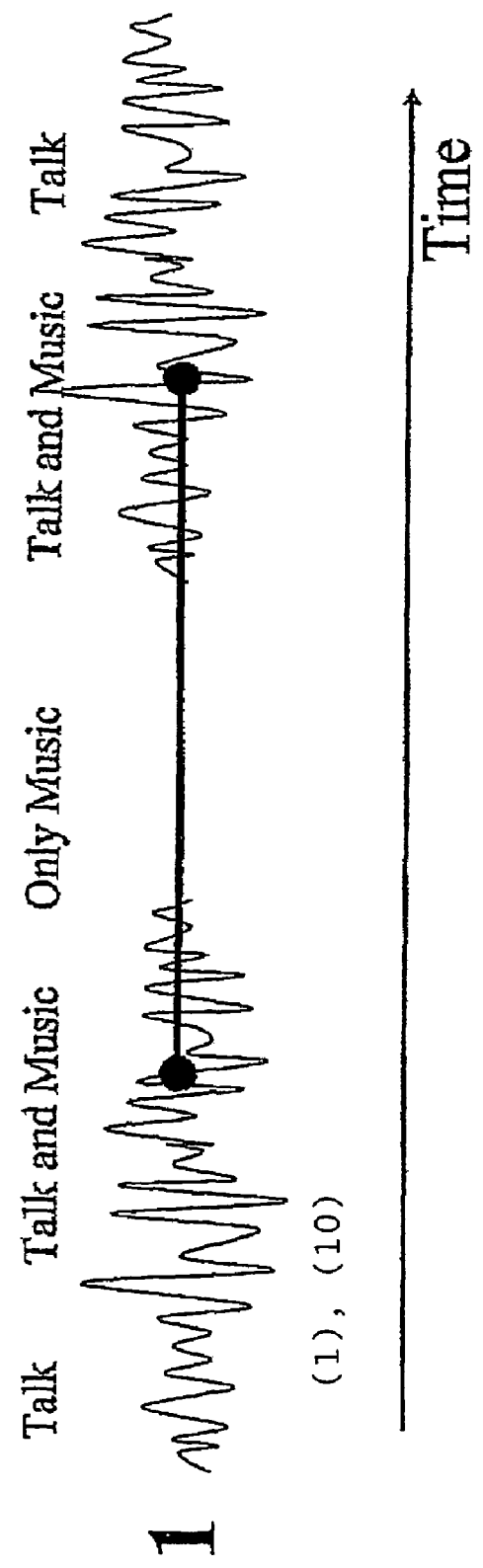
FIG. 1 shows, schematically, how a signal representation of a radio broadcast is separated into different parts, such as talk, music+talk and pure music.
Figure 2:
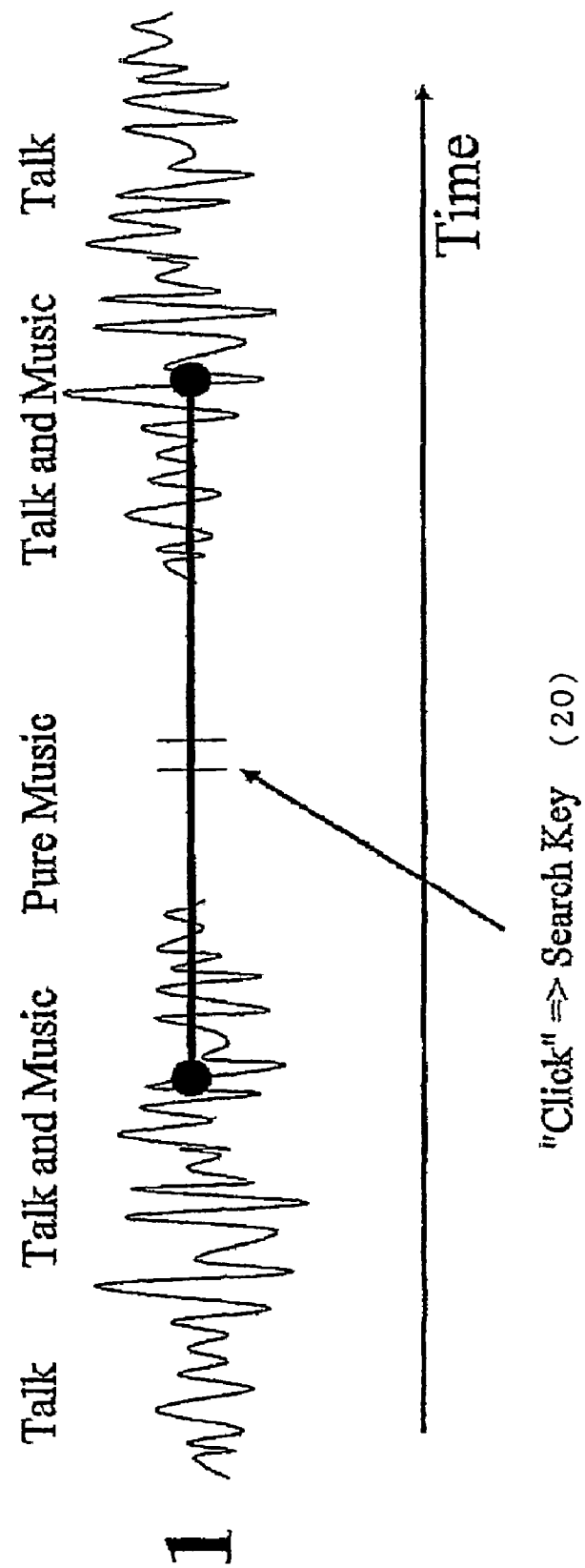
FIG. 2 shows, schematically, how a search key representation is chosen from a wanted music track.
Figure 3:
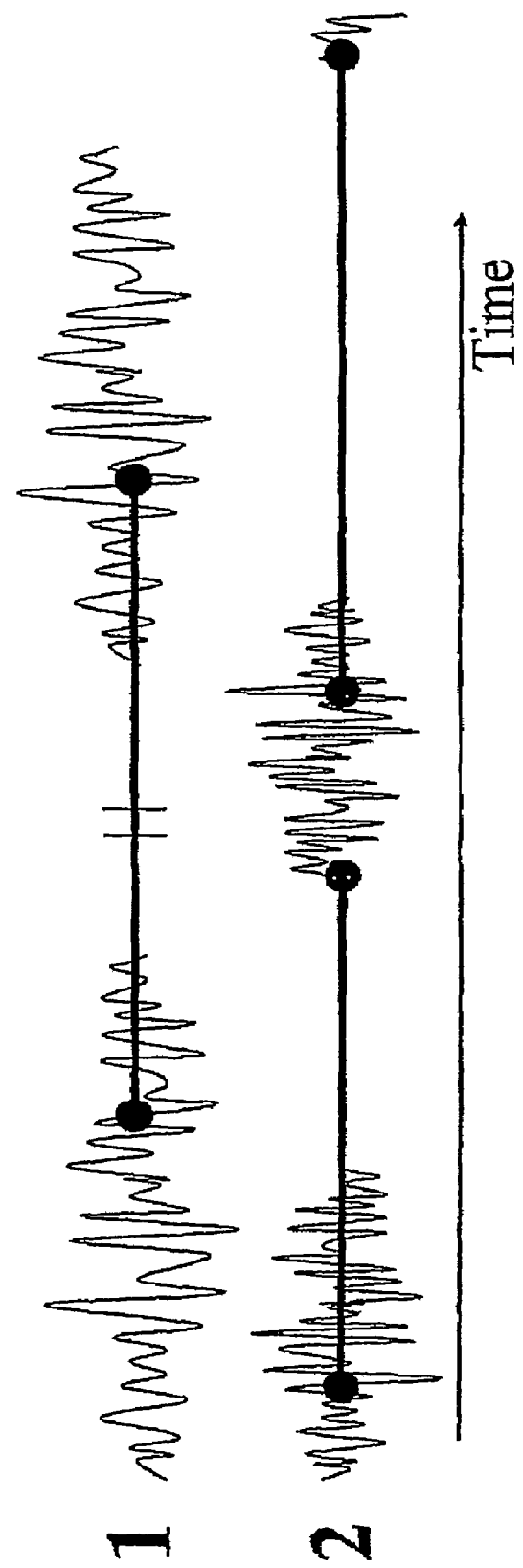
FIG. 3 shows, in a simplified way, how a search procedure for a wanted music track is performed by using the method according to the present invention.
Figure 4:
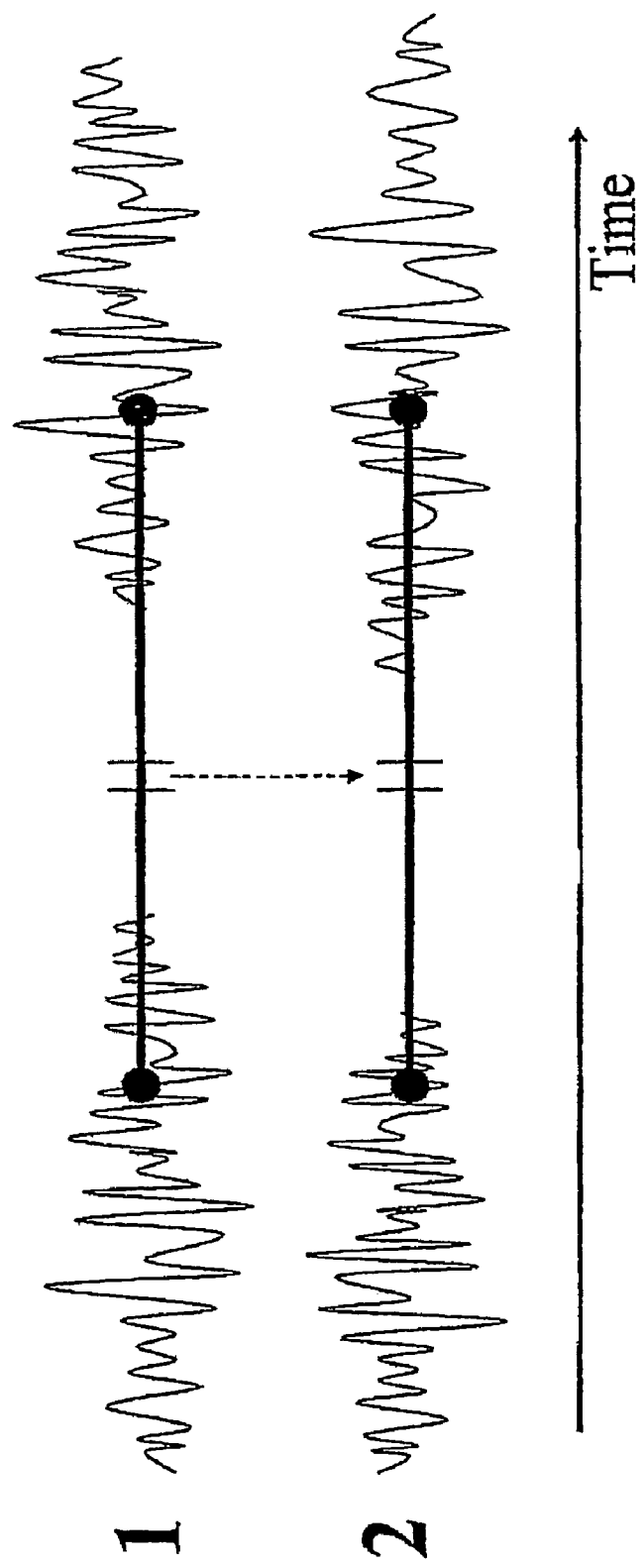
FIG. 4 shows, schematically, the method used for finding an exact copy of the search key representation.
Figure 5:
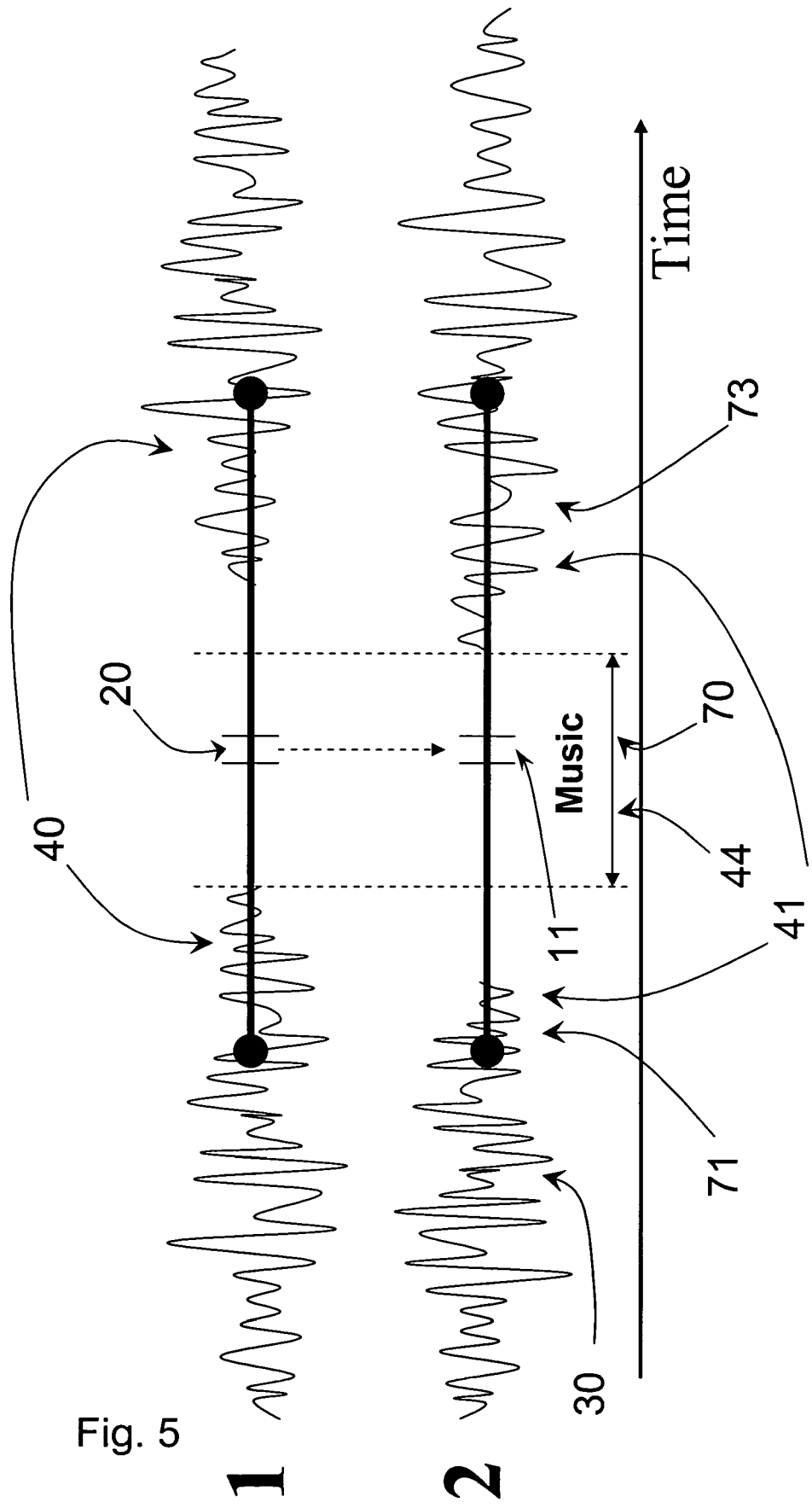
FIG. 5 shows the expansion of the signal representation in common segments.
Figure 6:
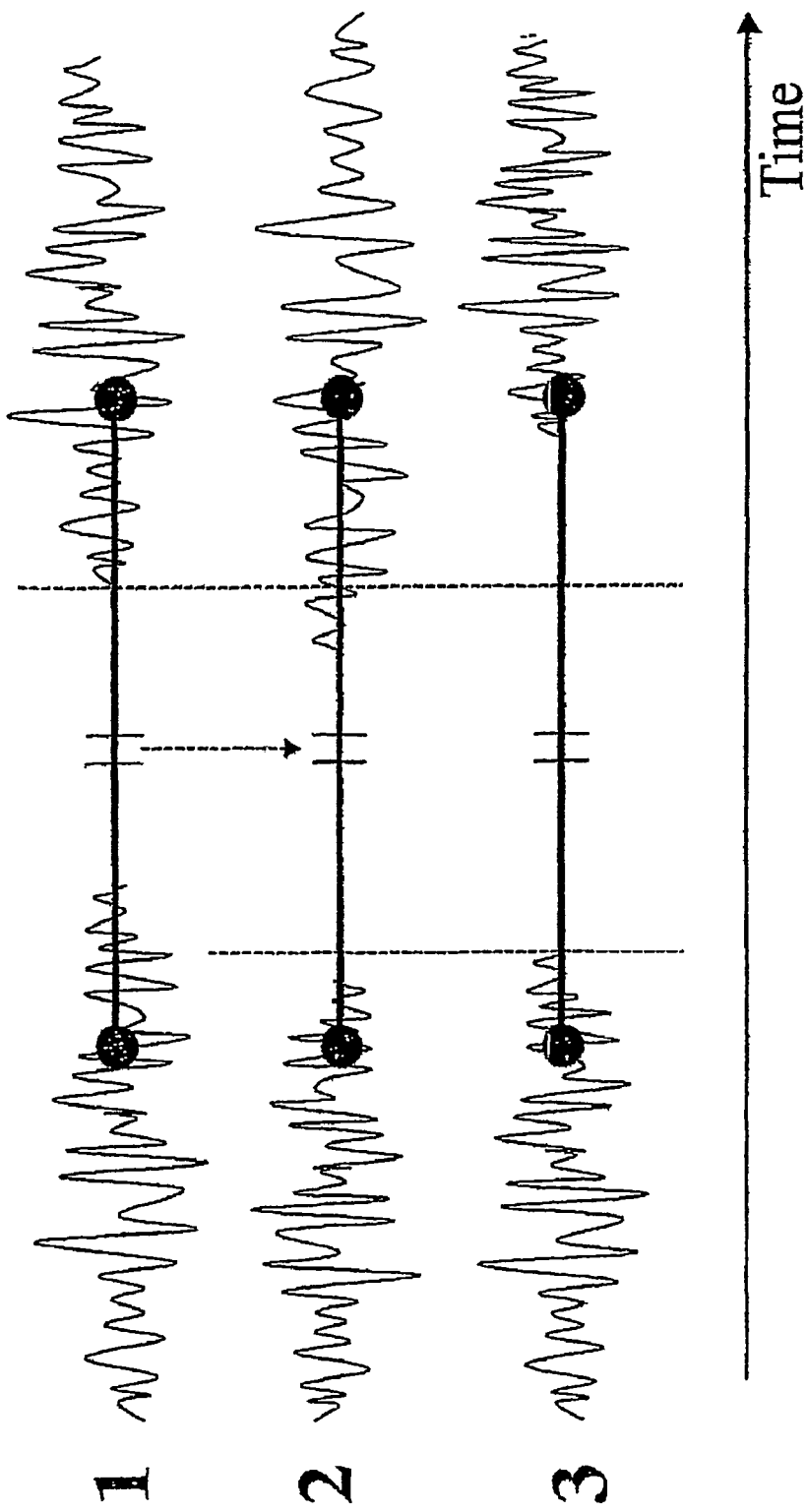
FIG. 6 shows, schematically, how the iteration process to get longer common segments works.
Figure 7:
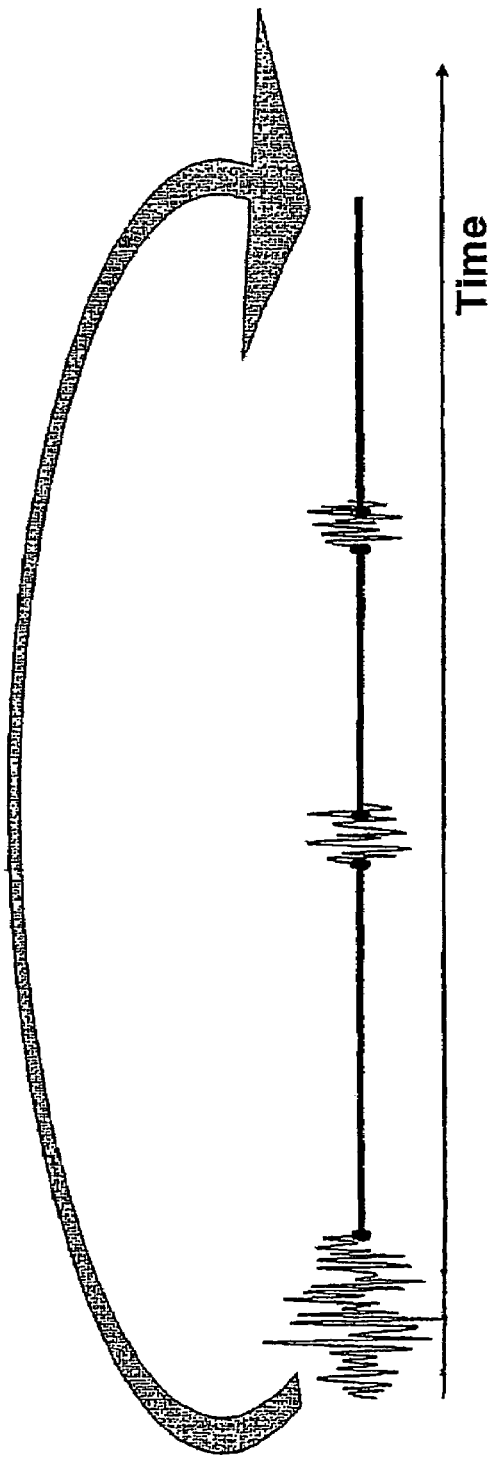
FIG. 7 illustrates how it is possible to search through the search track backwards in time by using a buffer memory.
Figure 8:
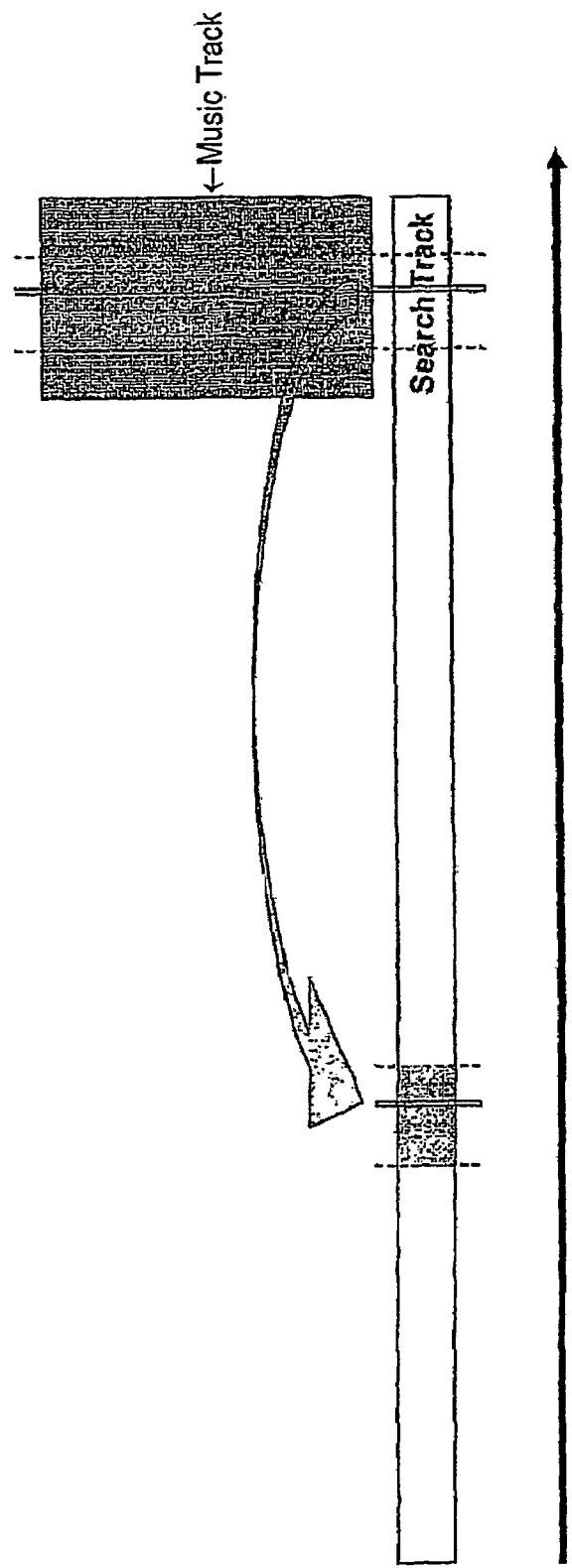
FIG. 8 shows, schematically, how a separate search track could be used with the present invention.
Figure 9:
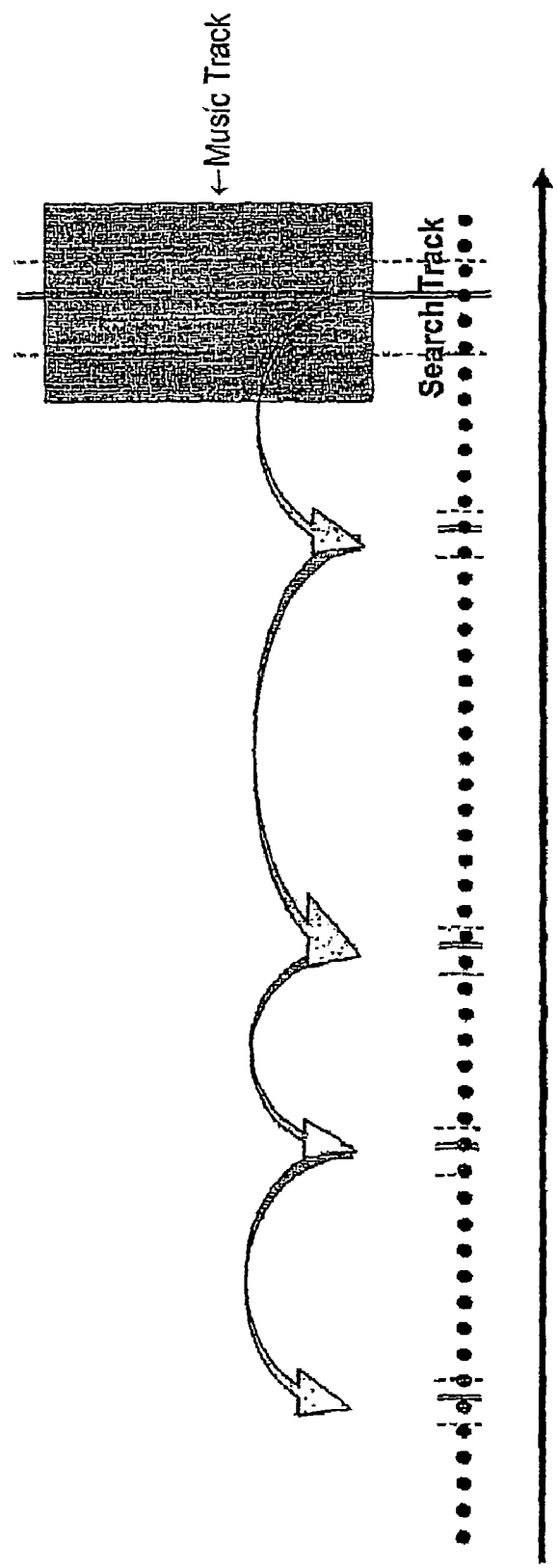
FIG. 9 illustrates, in graphic form, how to use a compressed search track when applying the method according to the present invention.
Figure 10:
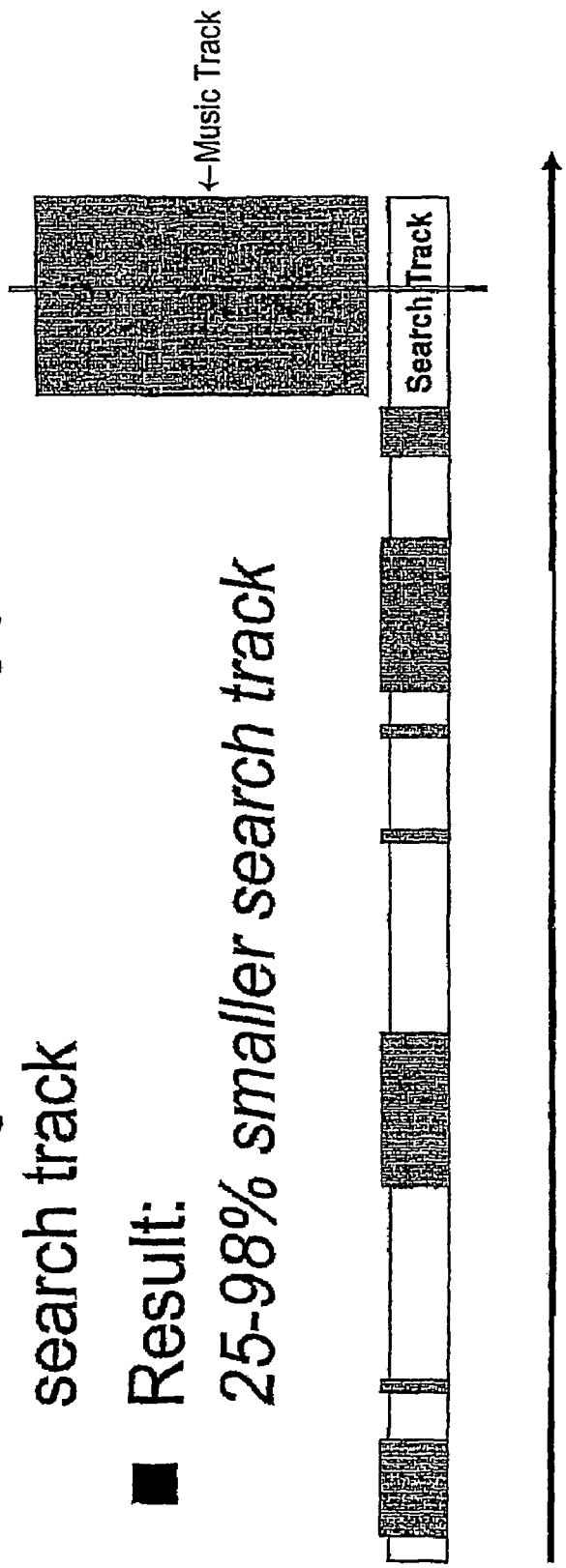
FIG. 10 illustrates, in graphic form, how the search track that is used in the present invention can be cathegorised into interesting and non-interesting parts.
Figure 11:
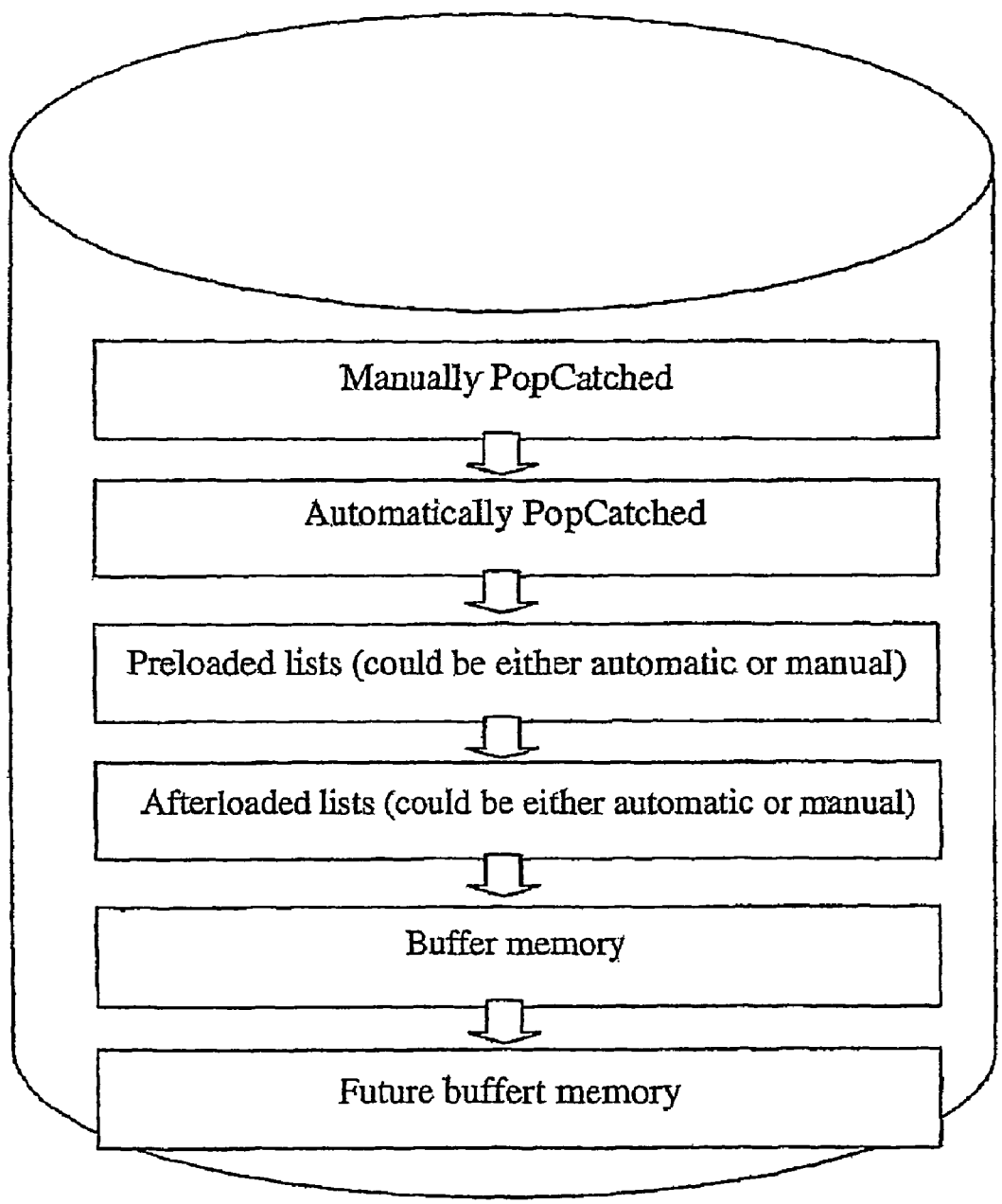
FIG. 11 shows a flow diagram that illustrates a possible approach for applying the method according to the present invention, in the drawings the term "pop-catched" signals means signals that have been processed according to said method.

In the following the invention will be described in greater detail, partly by using direct examples, partly by using preferred embodiments. These examples and embodiments should in no way be construed as limitations of the invention, they are only disclosed to make it easier to understand the invention. For example, in several places it is stated that the method is used in a process for recording music from a radio broadcast, to record movies, etc. These uses are only specific examples and the system could be used on all media signals and every source material that can be given a representation that makes the comparison process with search keys and iterations possible.

The method could, for example, be "done backwards" by saving only the material located between two known source materials that have been identified using the present method.

Preloaded Lists and Afterloaded Lists

The system and the method according to the patent application PCT/US02/05537, hereafter referred to as (S), are preferably equipped with preloaded lists and/or afterloaded lists. A preloaded list means a list with certain signal representations that are stored in a search memory, preferably only as undisplayable source material and search tracks (30), which representations are used as search material for the search key, and/or as material to perform the expansion comparisons. It could for example be a representation of a certain song, a certain jingle, a certain commercial etc. "Displayed" is intended to mean that the specific entity, for example the music track, is given a representation that makes it possible to use the entity in the comparison process, as this process is defined in either (S) or in this application. The selection of the signal representations (10) that are contained in the preloaded list could be chosen on statistical grounds, they could for example be particularly popular music tracks or often broadcasted commercials.

A preloaded list could be equivalently defined as a memory domain wherein signal representations are stored after they have been defined.

The preloaded list, which contains the essentially exact signal representations, is stored in a memory. When the comparison process according to (S) is activated, that is, when the search key (20) is set, the system according to the present invention could as a first measure search through the preloaded list and try to find an essentially identical copy of the search key representation (20). If a direct match of the search key representation (20) is found in the preloaded list, this representation, containing the essentially identical copy of the search key representation (20), could be compared to the search track (30) that contain the search key. In this way one knows what the correct representation of the music track looks like without unwanted contributions to the signals, and as a consequence the system does not have to iterate to get the final signal representation (10), instead the system could just wait until it finds a complete match between the search track representation and the representation in the preloaded list. Thereby, if an essentially identical copy of the search key (20) is found in a search track (30), the full search track representation of this search track is compared to the exact representation that is found in the preloaded list, and if an exact match is found the system knows that the whole original has been displayed and then records it with a sufficiently high qality, and distributes it to the user who desired to record the track. If there are differences between the search track (30) and the representation given in the preloaded list, the system realizes that there are unwanted signals present in the full media signal (1) and the system waits until the next match with the search key takes place. Again a comparison process is conducted to ensure either similarities or differences between the search track (30) and the exact signal representation. This process step can then be conducted until a full match has been found, and after that, the system records the broadcasted media signal, as this signal is perceived by the user, for example as a music track or a movie.

An afterloaded list, which will be described below, could equivalently be construed as a memory domain, in which domain the signal representation is stored after the representations have been defined.

An afterloaded list fulfills mainly the same purpose as a preloaded list, but an afterloaded list contains signal representations (10) that have been chosen by the system when it found a final version through iteration. In this way one gets a system which, so to speak, builds up its own base of signal representations (10), that is, the system creates its own preloaded list. An example could be used to illustrate the use of the afterloaded list. Assume that a user activates the comparison process according to the system (S), this is done when the user manually activates a search key choice by pushing a button when she hears a song on the radio. The system now preferably searches through the preloaded list. Assume further that the system did not find an exact match with the signal representations (10) stored in the preloaded list. The system will then continue to use the method according to (S) until it finds a good enough version. This version is now distributed to both the user who wanted the track it its original representation, i.e. as music in this case, and to a memory domain in which the song is stored as a chosen signal representation. In the memory domain, this signal representation is considered to be an exact signal representation of the unwanted music track. The content in the afterloaded list could now be used in an analogous way to the way the preloaded list is used.

The preloaded list could of course consist of any media signals (1). The specific signal (1) could be a representation of commercials, music tracks, moviea, jingles, the number of red pixels in a TV broaddcast, the sound from a TV broadcast, etc. The specifically wanted product determines the content. In the same fashion it is possible to load the representations of the unwanted signals into the afterloaded list. If, for example, a new commercial is used this commercial could quickly be given a representation that is loaded into the afterloaded list. Specific ranges of applications for this procedure will be described in what follows.

Choices of Search Key and Activation of Search Key Settings

How the search keys (20) are chosen and how this choice is activated are another area that this invention covers. As has already been mentioned, the search key choice could be activated manually by the user for example upon hearing a song on the radio. But an activation of the search key (20) could also be done automatically, through the system activating itself. An example is a system that activates itself every N:th second.

An example of an embodiment of the invention has a search key activation that is based on the flow of media signals (1). If, for example, a very weak signal is broadcasted, which is an indication of for example silence before a music track, darkness before a movie or a commercial or darkness before a TV-station logotype is displayed, etc., the search key (20) could be activated. After the search key (20) has been activated a search and comparison algorithm could be activated, either immediately after or after a certain predetermined time step following the activation of the search key. The predetermined time step could, in the case music is being recorded from a radio broadcast last a few minutes. In this manner, one avoids the possible scenario that the algorithm starts after the music track has ended, since the major part of a music track is at least a couple of minutes long, and one also avoids the scenario that the algorithm begins too early, for example, when a disc-jockey is talking.

Yet another possibility is to rank the search keys (20). One might, as an example, use more processing power on a manually activated search key in comparison with one that is automatically activated, and thereby give an automatically activated search key a lower rank and therefore devote less processing power to this key and give this key less time before it is considered as a failed search key. In case of a manually activated search key it is, for example, possible to have a longer search backwards in time and also to have a longer search forward in time to try to find a match to the search key. A further possibility is to influence the system so that it only searches for a search key match in the preloaded list. In this way, the search track could be cathegorized as to make future search procedures faster, something that makes less demands on the memory capacity.

Improvements of the Signal Representaions of the Search Tracks

As has already been mentioned, storing large amounts of signal representations in a memory is very demanding. The present invention solves this problem in a number of ways. These improvements, together with the above given improvements over (S) yields a system and a method designed to display recorded signals in a format where unwanted signals have been removed, either by, as an example, saving what one wants to hear/see and removing what one does not want to hear/see. But it is of course possible to save the signal representations with a log file that is later used to display the signal in order to decide what should be displayed and what should not.

A system and a method according to the present invention, that processes recorded media signals and display them without unwanted signal components take into consideration the fact that the search track, as this has been defined earlier, yields a signal representation that is much smaller than the original signal representation if some, or all, of the modifications that are given below are made. This will give a much cheaper system for the customer since the hardware, mainly the processor and the memory, are less costly.

It is possible to remove already known unwanted signals, such as commercials, etc., from the search tracks. This will leave more room in the memory that could be used for clean search tracks.

It is possible to remove signals that have been broadcasted during a time step that is shorter than a predetermined threshold value from the search track. The threshold value could for example, in the case of music being recorded from a radio broadcast, last one minute. Media signal representations (70) that lie between two signal representations (71, 73) contained in the memory domain and which are only broadcast during a time interval that is shorter than a minute are probably unwanted signals, for example, commercials or jingles, and probably not music since a music track in most cases is at least a couple of minutes long, so these representations are not required in the search track. This will quickly lead to a size reduction of the search track. It is, in the same way, possible to save this media signal representations (70) if, for example, the activation of the search key took place during the broadcast of such a media signal.

The invention claimed is:

1. A method for receiving media signals (1) through receiving means, said media signals (1) containing unwanted signal components; to choose a representation for said media signals and to process these media signals (1) in such a way that said unwanted signal components are essentially removed and the remaining signal components are saved, said method comprising the steps of:

from the media signals (1) choosing a first search key representation (20);

in a search track (30), conducting a first search to find a signal representation (10) that contains a section (11) which is essentially identical with said first search key representation (20);

comparing a first segment (40), which lies before and after said search key (20), with a second segment (41) which lies before and after said section (11) which is essentially identical with the first search key representation (20);

from said first segment (40) and said second segment (41) finding a first common segment (44);

loading said common segment (44) into a memory domain; and storing said common segment (44) in said memory domain as a signal representation (70) without unwanted signal components.

2. Method according to claim 1, wherein said first search (20) is conducted among media signal representations (70) stored in the memory domain.

3. Method according to claim 1, wherein if no essentially identical copy of the search key representation was found, carrying out the further step of conducting further searches in the search track to locate essentially identical copies of said search key representations and, when such a copy is found, conducting a comparison process to find common segments, and continuing this process until a final common segment is achieved or until the process is terminated, and then loading said common segment into the memory domain as a signal representation.

4. Method according to claim 1, including the step of removing all redundant signal representations from the search track if the search track contains a multiple of essentially identical signal representations, to thereby achieve a better use of the memory capacity.

5. Method according to claim 1, wherein a signal representation(70) that lies between two signal representations (71, 73) contained in the memory domain is removed if said signal representation(70) has a time duration that is shorter than a predetermined threshold value.

6. Method according to claim 1, wherein the section of a signal representation (70) that lies between two signal representations contained in the memory domain is saved if the setting of the search key was activated during this section.

7. Method according to claim 1, wherein said search track consist of every N:th sample of a signal representation (10).

8. Method according to claim 1, wherein the search tracks, when recorded, are normalized to have a common amplitude and sound level.

9. Method according to claim 1, wherein the signal representations (70) are selected from one or more of the group consisting of representations of music, talk, noise, jingles and logotypes.

10. Method according to claim 1, wherein the signal representations are one or more representations selected from the group consisting of music and movies.

* * * * *

UNITED STATES PATENT AND TRADEMARK OFFICE
CERTIFICATE OF CORRECTION

PATENT NO. : 7,593,850 B2 Page 1 of 1
APPLICATION NO. : 10/525370
DATED : September 22, 2009
INVENTOR(S) : Berg et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 902 days.

Signed and Sealed this

Twenty-eighth Day of September, 2010

David J. Kappos
*Director of the United States Patent and Trademark Office*